United States Patent
Schwoerer (10) Patent No.: US 7,355,541 B2
(45) Date of Patent: Apr. 8, 2008

(54) DIGITAL/ANALOG CONVERTER AND METHOD FOR DIGITAL/ANALOG CONVERSION OF A SIGNAL

(75) Inventor: Christoph Schwoerer, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/489,037

(22) Filed: Jul. 19, 2006

(65) Prior Publication Data

US 2007/0024480 A1    Feb. 1, 2007

(30) Foreign Application Priority Data

Jul. 28, 2005    (DE) .................... 10 2005 035 385

(51) Int. Cl.
*H03M 1/66*    (2006.01)
(52) U.S. Cl. ..................................... 341/144
(58) Field of Classification Search ............... 341/143, 341/144, 118
See application file for complete search history.

(56) References Cited

U.S. PATENT DOCUMENTS

| | | | |
|---|---|---|---|
| 5,008,674 A * | 4/1991 | Da Franca et al. ......... | 341/150 |
| 5,148,168 A | 9/1992 | Masuda et al. | |
| 5,323,157 A | 6/1994 | Ledzius et al. | |
| 6,950,049 B2 * | 9/2005 | Brooks et al. ............... | 341/143 |
| 2005/0040979 A1 | 2/2005 | Brooks et al. | |

FOREIGN PATENT DOCUMENTS

WO    WO 2004/034664 A2    4/2004

OTHER PUBLICATIONS

"Architectures for Delta-Sigma DACs", Gabor C. Temes, Shaofeng Shu and Richard Schreier, in Norsworthy, S. Delta Sigma Data Converters: John Wiley and Sons, 1997, pp. 309-332.
"Integrated Stereo Delta-Sigma Class D Amplifier", Eric Gaalaas, Bill Yand Liu and Naoaki Nishimura, ISSCC 2005/Session 6/ High-Speed and Oversampled DACs/ 6.6, IEEE International Solid-State Circuits Conference, 2005, 3 pgs.
"A Low-Power 98-Db Multibit Audio DAC in a Standard 3.3-V 0.35-μm CMOS Technology", Marzia Annovazzi, Vittorio Colonna, Gabriele Gandolfi, Fabrizio Stefani and Andrea Baschirotto, IEEE Journal of Solid-State Circuits, vol. 37, No. 7, Jul. 2002, pp. 825-834.

* cited by examiner

*Primary Examiner*—Brian Young
(74) *Attorney, Agent, or Firm*—Eschweiler & Associates, LLC (57) ABSTRACT

A digital/analog converter contains an input for supplying a first digital word having a first word length. A noise shaper is coupled to the input and is designed to convert the first digital word into a second digital word having a second word length and to output this digital word to an output. The output of the noise shaper has a filter device coupled to it which is designed to reject signal components in the second digital word. Finally, a conversion device is connected to the output of the filter device. The conversion device is designed to convert the second digital word into an analog signal and to provide the analog signal for an output. By filtering the signal which is output by the noise shaper, the noise components contained in the noise-shaped second digital word are rejected.

21 Claims, 6 Drawing Sheets

DIGITAL/ANALOG CONVERTER AND METHOD FOR DIGITAL/ANALOG CONVERSION OF A SIGNAL

REFERENCE TO RELATED APPLICATION

This application claims the benefit of the priority date of German application DE 10 2005 035 385.1, filed on Jul. 28, 2005, the contents of which are herein incorporated by reference in their entirety.

FIELD OF THE INVENTION

The invention relates to a digital/analog converter and to a related method for converting a signal.

BACKGROUND OF THE INVENTION

Fast digital/analog converters are required in modern communication systems for a large number of applications. In a conventional approach, the digital word having a length of N bits is converted into an analog signal. This is done by providing a digital/analog converter which comprises $2^N$ different signal levels as comparison and threshold values. Depending on the comparison, a corresponding analog output signal is then produced. However, this approach results in significant power consumption and a very large amount of space being taken up, since for each additional bit of resolution the number of threshold levels needs to be doubled. By way of example, a digital word having a length of 8 bits (N=8) can take up a total of 255 different analog signal levels. A digital word having a bit length of 9 bits (N=9) can be used to represent 512 analog values.

For this reason, modern converters very frequently sample the digital word using a very high clock signal and process the resultant signal further using a noise shaping method. This process is known generally as "noise shaping".

Figure 5:
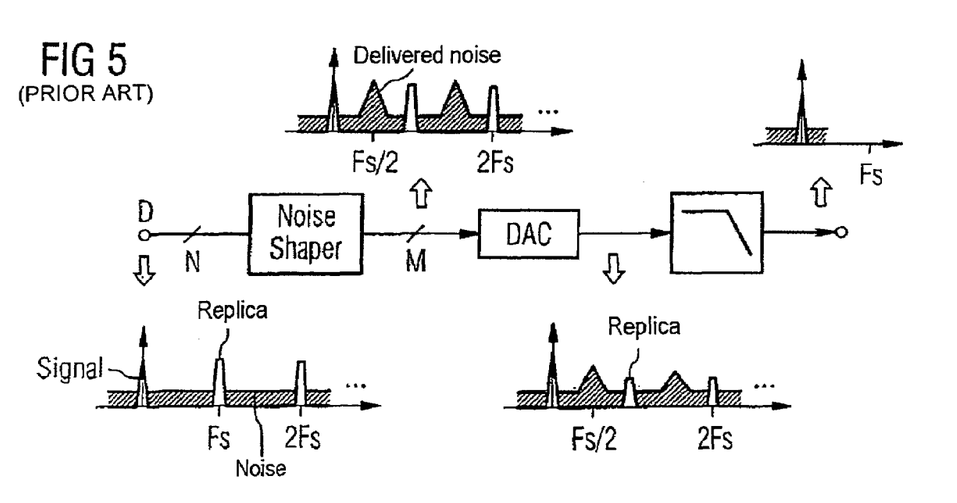
FIG. 5 is a block diagram illustrating a prior art digital/analog converter.

FIG. 5 shows a digital/analog converter operating on the basis of the known principle. In this case, the digital word or the digital signal D having a bit length N is supplied to a noise shaper. The noise shaper samples the digital word D at a much higher frequency $F_s$ than that of the digital data and produces a second digital word having the bit length M therefrom. The second digital word having the bit length M<N is supplied to the actual digital/analog converter DAC and is converted into an analog signal.

On account of the noise shaping, the conversion of the digital word D having the bit length N which is applied to the input into the digital word having the bit length M results in an improvement in the signal-to-noise ratio within a certain useful bandwidth relative to the bit length M. The useful bandwidth corresponds to the bit length N of the first digital data word D. The oversampling within the noise shaper moves a noise component of the digital data word applied to the input into higher frequency ranges and hence outside of the useful band spectrum.

This process is illustrated by the diagrams shown in FIG. 5. The data word D applied to the input contains the signal component and also a noise component (not shown here) which, in the present case, is white noise having a constant component. At the integer multiple sampling frequencies $F_s$ of the noise shaper, repetition spectra for the data words applied to the input are produced. At the output, the data word with the bit length M which is output accordingly has "repetition spectra" for the digital word D at the frequencies $F_s$, $2F_s$, etc. In addition, the noise shaping at half the sampling frequency $F_s/2$ produces a noise component which is moved into the higher frequency ranges by the noise shaper.

The data word converted in the noise shaper is now supplied to the actual digital/analog converter, which produces an analog signal therefrom. On account of the response sin (x)/x of the hold element, the conversion results simultaneously in additional attenuation for higher spectral components at the sampling frequency $F_s$ and also the associated harmonic frequencies. These higher components are then rejected in a low-pass filter, and the output produces the converted analog signal with a relatively small noise component.

The noise components which the noise shaper moves into higher frequency ranges are then rejected by the low-pass filter. The resolution of the noise shaper and also of the digital/analog converter is better the higher the bit length M of the second data word. Equally, the order of the noise shaper and the oversampling rate need to be taken into account.

In this context, however, the linear response of the digital/analog converter DAC needs to be taken into account. Nonlinear components in the response produce additional intermodulation products. These can result in the noise component which the noise shaper moves into higher frequency ranges being convoluted back into the required frequency band. This impairs the signal-to-noise ratio in the useful band.

Particularly in the case of digital/analog converters for audio applications, these intermodulation products can be adopted in the output signal as interfering noise. Implementing a very linear digital/analog converter is very complex, however, and results in additional costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention provides a digital/analog converter which has an improved noise rejection response. The method for digital/analog conversion which is likewise proposed here allows interfering noise to be reduced. Various refinements and aspects of the invention are specified in the claims. In this context, the features can be combined in various ways without this conflicting with the essence of the invention.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

Various aspects and refinements of the invention are explained in detail below. Some embodiments are discussed with reference to the figures, these disclosing different aspects of the invention. Components which have the same function or action may bear the same reference symbols.

In the drawings.

DETAILED DESCRIPTION OF THE INVENTION

In one aspect of the invention, a digital/analog converter has a noise shaper which is coupled to an input of the digital/analog converter for the purpose of supplying a first digital word having a first word length. The noise shaper is configured to convert the first digital word into a second digital word having a second word length and to output this second word to an output. It is likewise configured to convert a noise component in the first digital word to a higher frequency. The digital/analog converter also contains a conversion device whose input is coupled to the output of the noise shaper. The conversion device is configured to convert the second digital word into an analog signal and to provide the analog signal for an output. In addition, a filter device is provided which is connected between the noise shaper and the conversion device, and is configured to reject signal components in the second digital word.

With the refinement, the second digital word is filtered before it is supplied to the conversion device. The filtering means that radio-frequency signal components in the second digital word are rejected. This also reduces intermodulation products on account of nonlinear components in the transfer characteristic of the conversion device.

In another embodiment of the invention, an input is provided for supplying a first data word having a bandwidth and a noise component in the bandwidth. Coupled to the input is a means for converting the noise component in the first digital data word into a signal outside of a frequency range determined by the bandwidth and for producing a second data word having a word length. A number of bit lines, designed to output a respective bit from the second data word, are connected to the conversion means. In addition, a filter device is coupled to the bit lines. A digital/analog converter is coupled to the filter and is used to output an analog signal from a digital word applied to the input.

In a further embodiment of the invention, the filter device contains at least two subfilters. The output of the noise shaper has a first and a second suboutput, with a respective subfilter being connected to one of the outputs. At each suboutput of the noise shaper, it is possible to tap off a bit of the noise-shaped second digital word. As a result, at least one bit of the second digital word is filtered by the subfilter, and hence the higher-frequency component within this bit is rejected. In other words, at least one suboutput for providing a bit from the noise shaper has a downstream filter. In one embodiment of the invention, each suboutput of the noise shaper has a downstream filter. Hence, the bit lines, the total number of which transmit the second digital word, are connected to a respective subfilter. The total number of subfilters forms the filter device. In this arrangement, provision may be made for individual subfilters to have different filter characteristics.

In one embodiment of the invention, the filter device comprises a passive filter which has an RC element. The filter device forms an analog filter with a low-pass filter characteristic. In another embodiment, the filter device contains an active filter. The active filter has an amplifier with a first input connected to a signal path, and a second input. The output of the amplifier is fed back to one of the two inputs.

In another embodiment of the invention, the noise shaper comprises a sigma-delta modulator. The sigma-delta modulator samples the first data word applied to the input at a sampling frequency and produces a second digital data word therefrom with a second word length. The word length of the second digital data word is shorter than the word length of the first digital data word. In one development of this embodiment, the sigma-delta modulator is configured with a third-order cascaded modulator. This forms a third-order MASH modulator (Multi-Stage Noise Shaping Modulator).

In a further embodiment of the invention, the conversion device comprises a multiplicity of regulatable voltage sources which are connected to the output of the digital/analog converter. The regulatable voltage sources have a respective control connection which are respectively coupled to the output of the filter device to produce individual actuation for the voltage sources. In one embodiment, the filter device accordingly contains a plurality of suboutputs which are connected to a respective control connection of the regulatable voltage sources.

This means that the individual regulatable voltage sources can be actuated by the signals tapped off at the suboutputs. In one possible embodiment of the invention, the individual voltage sources within the conversion device are produced in the same way. This means that they respectively output the same voltage. In another embodiment of the invention, two voltages which are output by two respective voltage sources differ by the factor two. This achieves more accurate weighting for the individual voltage sources in the conversion device. Naturally, it is also possible to use current sources instead of the voltage sources in the conversion device and in this way to produce an analog current signal.

In one possible embodiment of the method for digital/analog conversion, a digital word having a first word length is accordingly provided. This word is transformed into a second digital word having a second word length, the second digital word being represented by a number of subwords. The number of subwords corresponds to the second word length. At least one subword from the second digital word is then subjected to analog filtering, and this produces an analog signal.

The transformation of the digital word moves a noise component in the digital word into a higher frequency band. The digital word is therefore noise shaped. The second digital word is then subjected to analog filtering by supplying at least one bit to an analog filter. In one refinement of the method, each bit of the second digital word is subjected to analog filtering. In this embodiment, each bit forms the subword from which the second digital word is made. Accordingly, filtering takes place before supply and conversion into an analog signal.

This allows a reduction in the noise component, in particular, which causes intermodulation products during the step of producing an analog signal from the digital word and thus results in a reduction in the signal-to-noise ratio. In another embodiment of the invention, the analog output signal is then filtered again so as to reject the repetition spectra and the shaped noise which is left during transformation and analog filtering.

Figure 1:
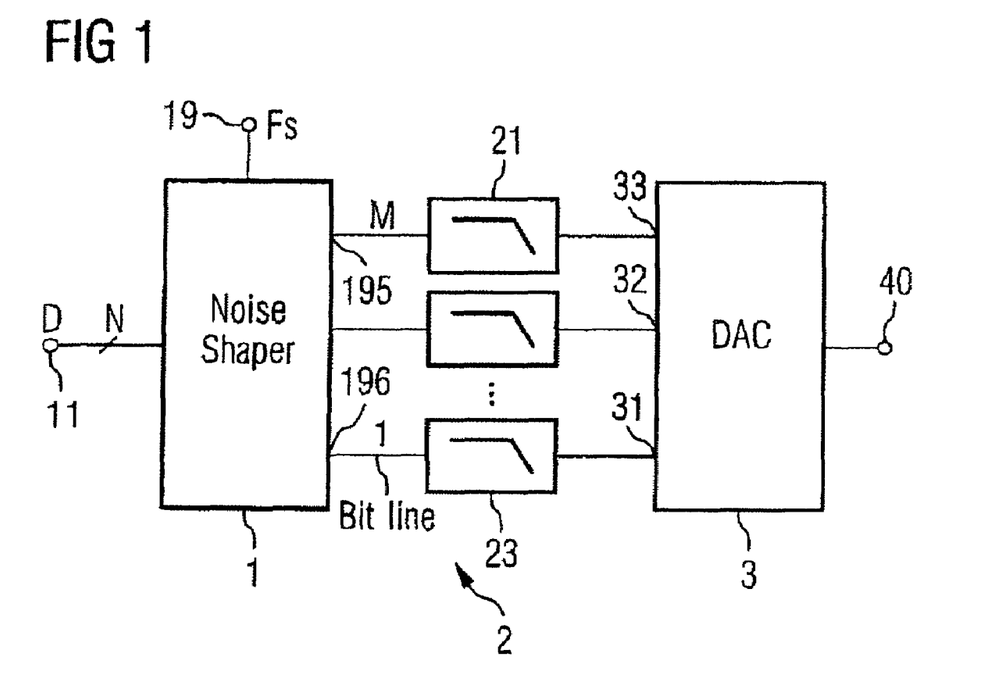
FIG. 1 is a block diagram illustrating one embodiment of the invention.

FIG. 1 shows a digital/analog converter, as can be used for a wide variety of applications, in detail. The converter shown in this example is in the form of an integrated circuit in a semiconductor body (not shown). On its surface, the semiconductor has a plurality of contact points which are used firstly for supplying signals or for providing signals. Further contact points are provided for supplying supply voltage or supply current to the individual elements of the digital/analog converter.

The converter shown comprises a digital signal input 11 to which a data word having the bit length N is supplied. In the text below, the term bit length is understood to mean the number of bits which form the data word. A bit length of N=8 means that the data word comprises 8 bits and hence can assume the numerical values 0 to 255, for example. In typical embodiments, the bit length of the supplied data word is N=8 to 16. One also refers to the word length of a data word in this connection.

The input 11 is connected to a noise shaper 1. This has a clock signal input 19 to which a clock signal is supplied at the sampling frequency $F_s$. In this context, the sampling frequency $F_s$ of the clock signal is chosen to be significantly higher than a clock frequency for the data word which is applied to the input 11.

By oversampling the first data word applied to the input, the spectral noise density of the first data word is reduced by the factor of the oversampling. This allows a further reduction in the quantization noise in the required frequency band. The noise shaper 1 transforms the data word having the bit length N which is applied to the input into a second data word having the bit length M. In this context, the bit length M is chosen to be shorter than the bit length N. In addition, the noise shaper 1 has a plurality of output taps 195, 196 at which it is possible to tap off a respective bit of the transformed second data word. The total number of output taps 195, 196 forms an output of the noise shaper which produces the second transformed data word having the bit length M.

The noise shaped data word is provided at the output of the noise shaper. The output comprises a number M of bit lines, with one respective bit being present on a bit line.

Each bit line is now connected to an individual low-pass filter 21, 23. This rejects higher-frequency components in the signal which is output at the respective output. This reduces the higher-frequency components on each individual bit line. The total number of these higher-frequency components in the individual bit lines produces the quantization noise and thus limits the total signal-to-noise ratio within and outside of the useful band. The outputs of the filters 21 to 23 are connected to the inputs 31 to 33 of a conversion device 3.

This takes the individual, now filtered, bit values supplied to the input and produces an analog signal and outputs it at the output 40. On account of the filtering and the associated reduction in the quantization noise in the second data word, the demands on the linearity of the conversion device are no longer so high. Hence, intermodulation products are produced particularly by nonlinearities in the conversion device and are convoluted back into the useful band during the conversion. The filtering reduces the noise components which are convoluted back. The signal quality is therefore improved while the linearity of the conversion device remains the same. Conversely, the demands on the conversion device, that is to say particularly component variations and matching, can be reduced.

Figure 8:
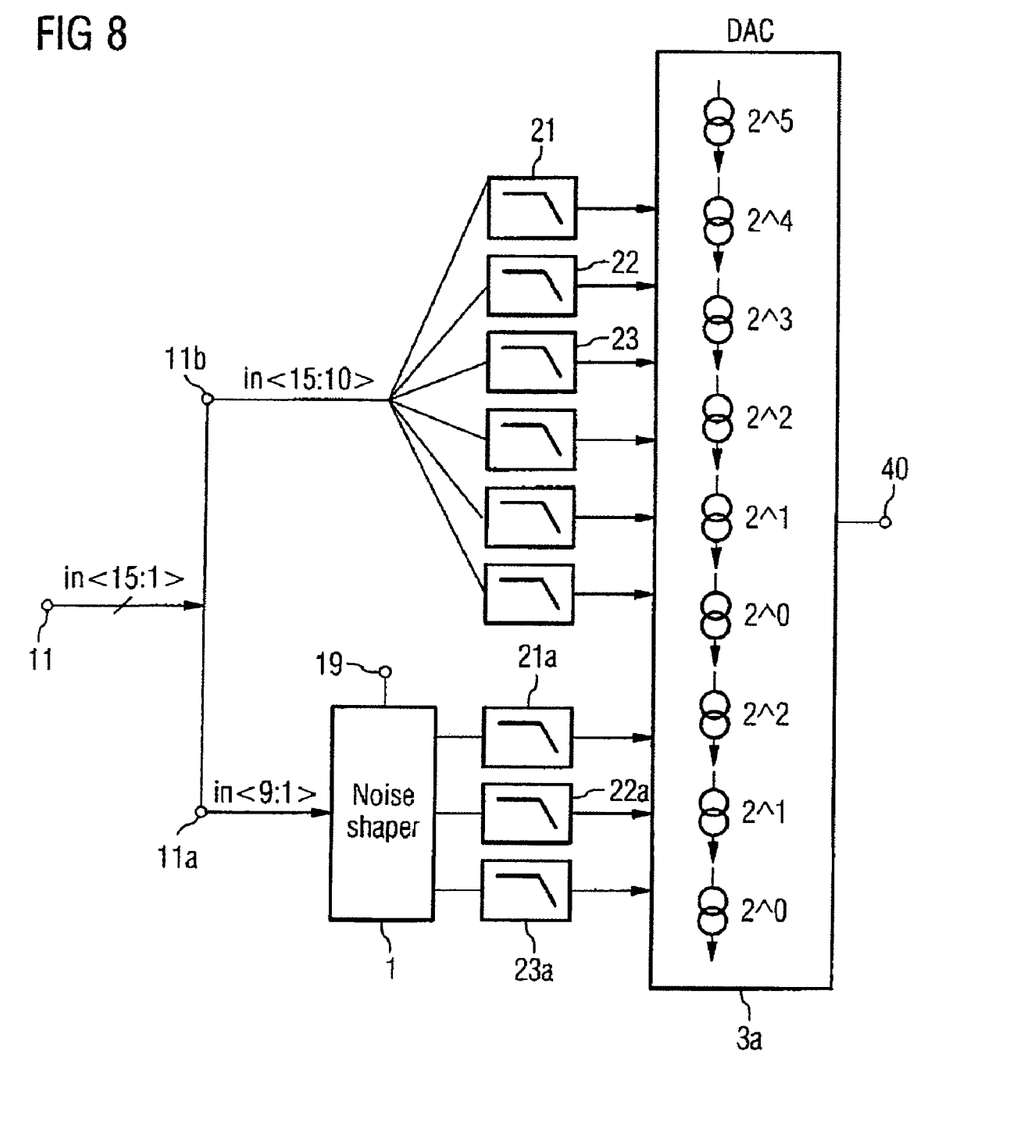
FIG. 8 is a schematic diagram illustrating another digital/analog converter according to yet another embodiment of the invention.

FIG. 8 shows a further embodiment of a digital/analog converter. Components which have the same action or function bear the same reference symbols. In this refinement, noise shaping is not performed with the complete supplied digital word, but only with the least significant bits.

The input 11 of the digital/analog converter is designed to supply a digital word having a bit length of 15 bits. The input word is split into the six most significant bits and is supplied to the input 11b. Each individual bit line of the input 11b is in turn connected to a filter 21, 22, 23 etc., and these filter the signal on the relevant line.

The nine remaining least significant bits are applied to the noise shaper 1. This takes the data word supplied to the input and produces a new word having a bit length of 3. At the output, the noise shaper 1 has each individual bit line connected to a filter 21a, 22a, 23a. The outputs of all the filters are connected to a conversion device 3a. This contains a plurality of current sources with different weighting. The supplied and filtered signals are combined in part and converted into an analog signal using the current sources in the conversion device 3a. In the embodiment shown, the implementation complexity for the noise shaper 1 has been reduced in that the latter contains only one data word with the bit length 9 as input word.

Figure 2:
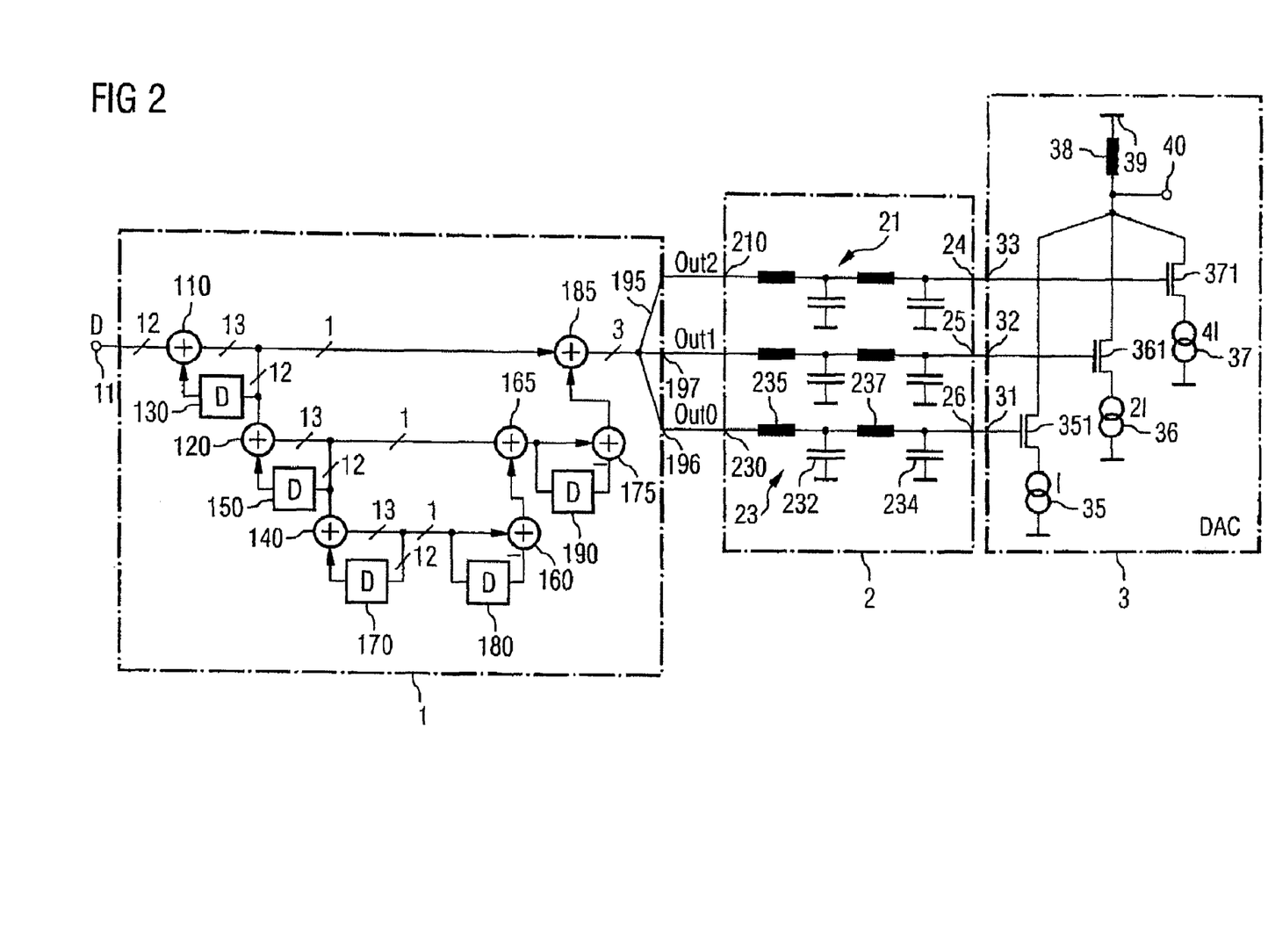
FIG. 2 is a schematic diagram illustrating a digital/analog converter according to an embodiment of the invention.

FIG. 2 shows another embodiment of a digital/analog converter according to the present invention. Components which have the same action or function bear the same reference symbols in this case too.

In the embodiment, the noise shaper 1 is in the form of a cascaded sigma-delta modulator. This is also called a MASH modulator. In the present exemplary embodiment, it is configured to supply a data word D having the bit length N=12. The data word D is applied to the data input 11. The data input 11 is connected to a first summator or summing element 110 in the modulator. This takes the 12-bit data word D and produces a transformed word having a bit length of N=13. To this end, the output of the summator 110 is connected to a second input of the summator 110 via a first delay element 130. The delay element 130 is likewise supplied with the data word having the bit length N=12. The least significant bit in the data word having the bit length 13 is processed further and is applied to a further summator 185.

The extracted data word having the bit length 12 is applied to a second summing element 120. The second summing element has a further input connected to its output via a delay element 150. It forms a second stage of the sigma-delta modulator 1 and reduces the quantization error by virtue of the feedback. In this case too, the least significant first bit is extracted from the sum output by the summing element 120 and is supplied to a further summator 165. The further 12 bits are applied to the delay stage 150 and are supplied to a third summing element 140. The third summator 140 together with the delay elements 170 and 180 form the third stage of the sigma-delta modulator 1. To this end, a second input of the summator 140 is fed back to its input via the delay element 170. In this case too, the least significant bit is again extracted and applied to a subtractor 160. At the same time, it is supplied to the second delay element 180.

The subtractor 160 forms the difference between the delayed output signal and the bit supplied to the input. The output of the subtractor 160 is connected to a second input of the summator 165. The result is supplied to a second subtractor 175. At the same time, it is applied to a further delay element 190, whose output is connected to the second input of the subtractor 175. The output of the second subtractor 175 is connected to the second input of the summator 185. As output signal, the summator delivers a data word having the bit length N=3. The three-bit data word is provided on the output taps 195, 196 and 197. The individual output signals Out0, Out1 and Out2 together form the respective second digital data word. In this case, each individual output signal comprises one respective bit.

The output taps of the sigma-delta modulator are connected to a filter device 2 with individual subfilters 21 to 23. Each individual subfilter 21 to 23 is in the form of a passive RC low-pass filter in the present case. Accordingly, the signals Out0, Out1 and Out2 are subjected to analog filtering on the individual bit lines.

The filter devices 21 to 23 have two respective series-connected resistors 235 and 237. Between the two resistors there is a node which is connected to a first capacitor 232. The second connection of the capacitor 232 is connected to the reference potential connection. Similarly, the second resistor 237 has a further capacitor 234 connected downstream of it. The resistors and the respective downstream capacitors form a simple RC element with a low-pass filter characteristic. The filtered individual signals are provided on the output taps 26, 25 and 24 of the individual filters. The output taps are coupled to the signal inputs of the conversion device 3.

In the present example, the conversion device contains three parallel-connected current sources 35, 36, 37. The size of the current sources differs by the factor 2 in each case. Thus, the current source 36 is designed to output a current which corresponds to double the current which is output by the current source 35. Accordingly, the currents which are output by the sources 36 and 37 likewise differ by the factor 2. This conversion device, called a current steering source, accordingly contains a plurality of binary-weighted current sources. These are actuated by the individual switches in the form of field-effect transistors 351, 361 and 371.

The control connections of the transistors 351, 361 and 371 are respectively connected to the input connections 31, 32 and 33. The supplied signals are used to disconnect and connect the individual current sources and hence add them to produce a total current. This current is converted into an output voltage by means of the downstream current/voltage converter in the form of the resistor 38 and is provided on the output 40 as an analog signal.

On account of the analog filtering of the individual output signals Out1, Out2 and Out3, which respectively comprise one bit, the switching process for the individual current sources now takes place without additional noise. This means that the noise component in the analog output signal at the output 40 is also reduced.

Figure 3:
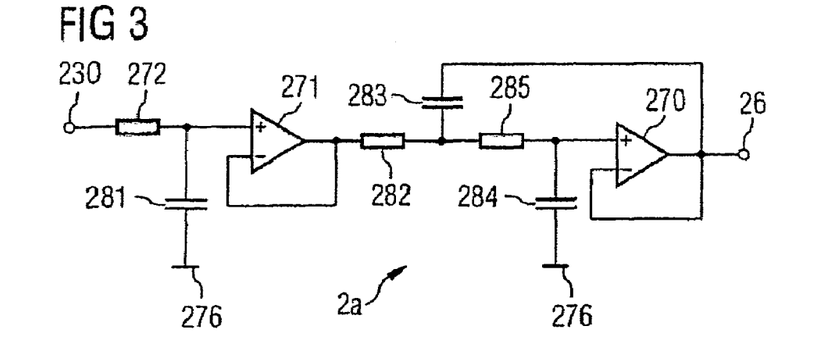
FIG. 3 is a schematic diagram illustrating an active analog low-pass filter.

FIG. 3 shows an embodiment of an active filter for rejecting radio-frequency components in the individual output signals. The figure shows a third-order Bessel low-pass filter. This comprises a resistor 272 which is connected to a first noninverting input "+" of an operational amplifier 271. The first input "+" of the operational amplifier 271 also has a capacitor connected to it whose other connection is connected to the reference potential. The output of the operational amplifier 271 is fed back to its inverting input "−". The resistor 272, the capacitor 281 and the operational amplifier 271 form a first first-order low-pass filter. This has a second-order low-pass filter connected to it which, in the present case, is formed from the capacitors 283, 284, the resistor 285 and the operational amplifier 270.

In addition, the second connection of the resistor 282 is connected firstly to the resistor 285 and secondly to the capacitor 283. The capacitor 283 couples the output of the second operational amplifier 270 to the resistor 285. The second connection of the resistor 285 is connected to the noninverting input "+" of the operational amplifier 270 and also to the capacitor 284. The output of the operational amplifier 270 is fed back to its inverting input and is connected to the filter output 26. The active second-order low-pass filter with the capacitors 283, 284 and the operational amplifier 270 is produced with a positive-feedback amplifier 270. The positive feedback is effected via the capacitor 283. An appropriate choice of values for the individual resistors and for the capacitors allows the required cutoff frequency to be set precisely and hence matched to optimum noise rejection on the individual bit lines. This allows the cutoff frequencies for the low-pass filtering to be chosen on the basis of the output signals and the individual bit lines.

Figure 4:
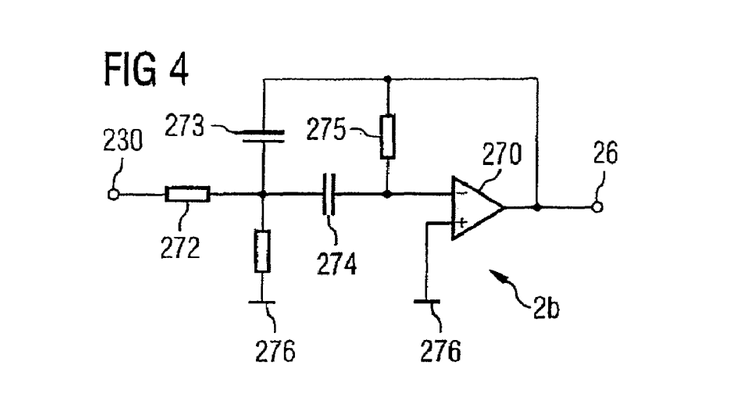
FIG. 4 is a schematic diagram illustrating an active analog bandpass filter.

An alternative embodiment of the filter in the form of a bandpass filter is shown in FIG. 4. This is produced with multiple negative feedback. The input 230 is connected to the inverting input "−" of the operational amplifier 270 via a resistor 272 and a capacitor 274 which is connected in series therewith. Between the resistor 272 and the capacitor 274 there is a node which is coupled to the reference potential connection 276 via a resistor. Similarly, the node is connected to the capacitor 273. Provided in parallel with the capacitor 273 is a resistor 275 whose first connection is connected between the inverting input "−" and the capacitor 274 and whose second connection is connected to the output of the operational amplifier 270. The noninverting input "+" of the operational amplifier 270 is similarly connected to the potential connection.

The active filter shown has the advantage that it does not tend to oscillate automatically at the resonant frequency, even as a result of the individual elements not being proportioned entirely exactly. This naturally requires suitable frequency correction of the operational amplifier 270.

Figure 6:
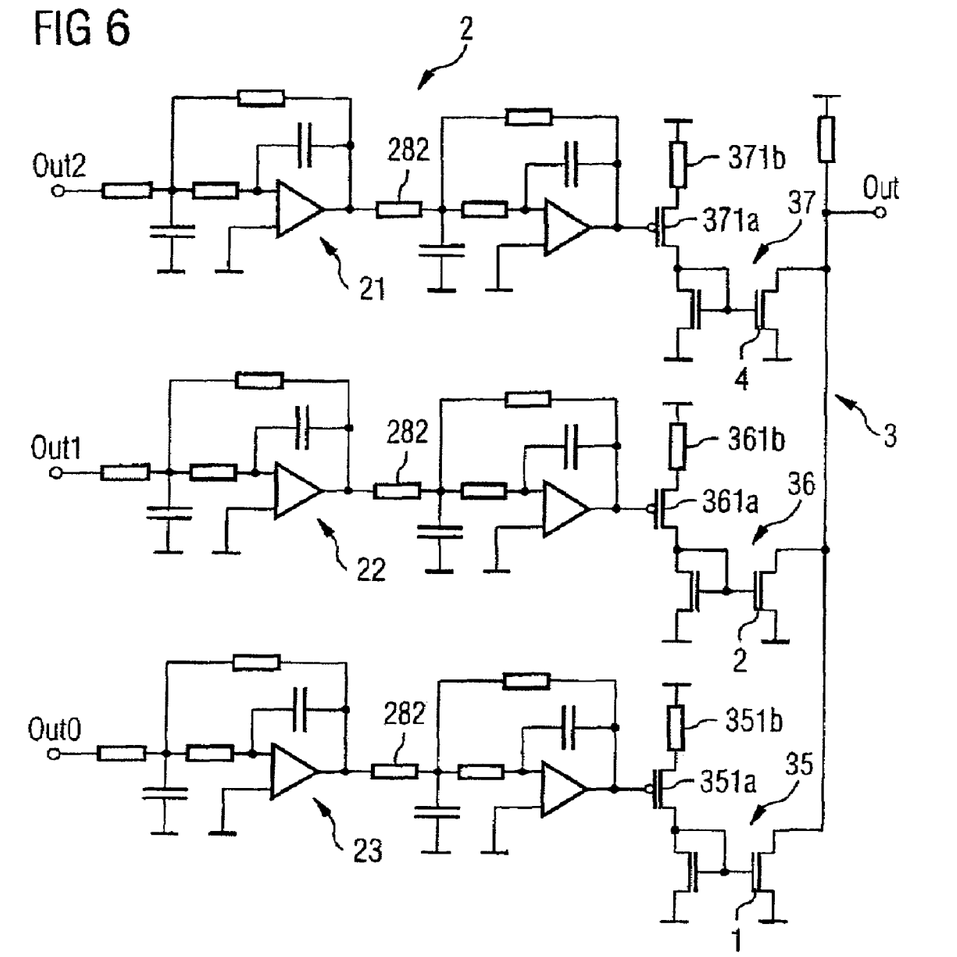
FIG. 6 is a schematic diagram illustrating an active filter device according to an embodiment of the invention.

In this regard, FIG. 6 shows a further refinement of a filter device 2 with three individual active filters 21, 22 and 23. The individual active filters 21, 22 and 23 are in the form of fourth-order low-pass filters with a Bessel transfer function. For this, two respective filters are connected together via a resistor 282. Each filter comprises an operational amplifier whose output is fed back to one of its inputs via a capacitor. Arranged in parallel with the capacitor is a resistor which is likewise connected to the input of the operational amplifier via a further resistor.

In this embodiment, an output of the second filter and particularly of the second operational amplifier is coupled to a control connection of a p-MOS field-effect transistor 351$a$. The latter forms a switch for a current source 35 to 37 in the conversion device 3. The field-effect transistor in this example comprises a source follower and has one connection connected to a supply potential via a resistor 351$b$, 361$b$ or 371$b$. The resistors 351$b$, 361$b$ and 371$b$ act as voltage/current converters and produce a respective current, which is supplied to a current mirror transistor, via the field effect transistors 351$a$, 361$a$ and 371$a$ from the voltage which can be tapped off at the output of the filters. This current mirror transistor mirrors the current into an output current. As shown here, the current mirrors are configured using different numbers of parallel-connected output transistors. This achieves a binary weighting in this example.

Figure 7:
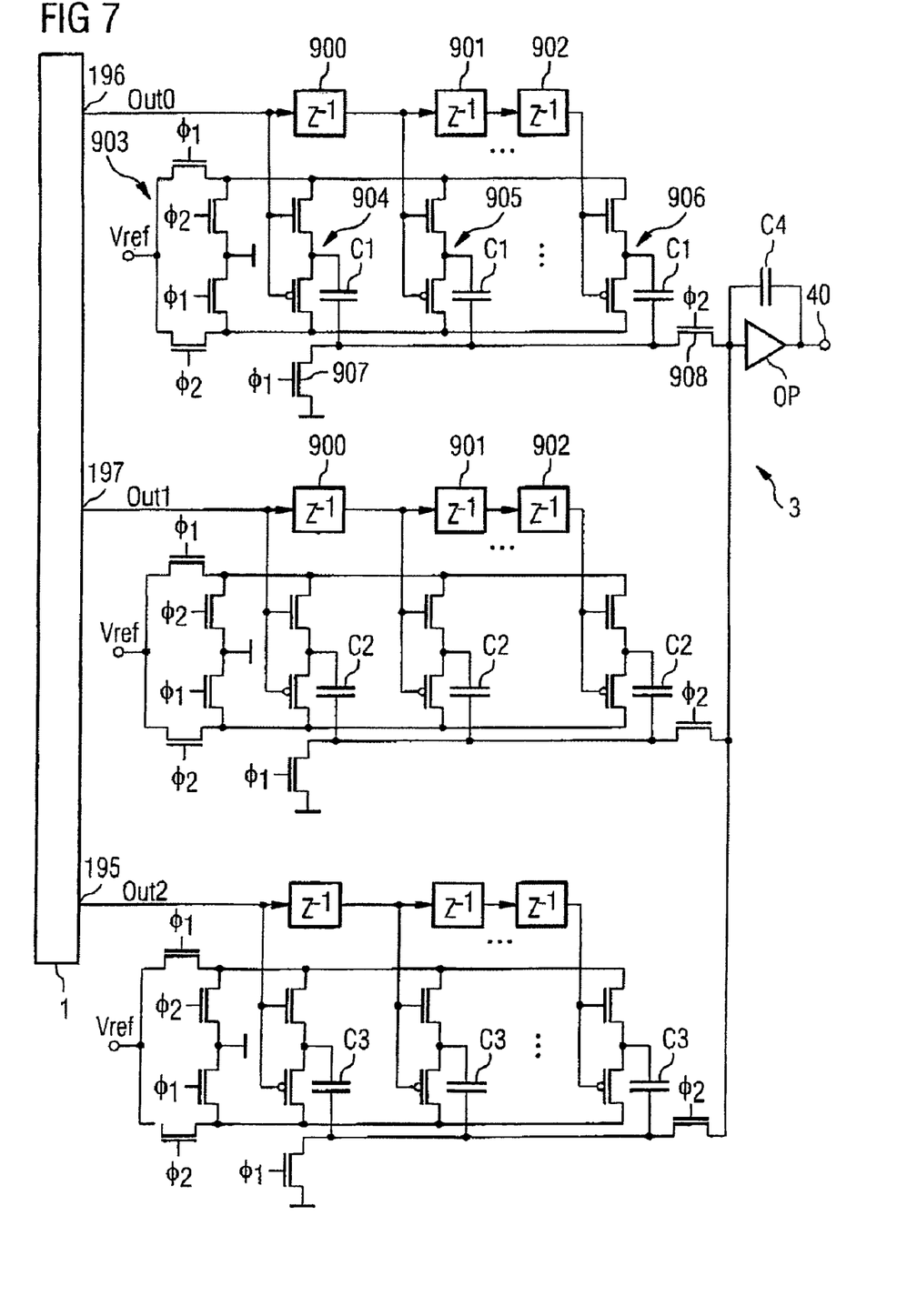
FIG. 7 is a schematic diagram illustrating another digital/analog converter according to an embodiment of the invention.

FIG. 7 shows another embodiment of the inventive digital/analog converter. In this case, the conversion device is produced using switched-capacitor technology. The individual capacitances $C_1$, $C_2$ and $C_3$ also act as low-pass filters.

Specifically, each individual filter comprises a plurality of series-connected delay elements 900, 901, 902, of which three are shown here. The delay elements delay a bit applied to the input by one respective clock period. The first delay element 900 is connected to the output 195 of the noise shaper 1.

In addition, the filter contains a reference input for supplying a reference voltage Vref. The reference input is connected to a device 903. This device contains two respective pairs of series-connected field-effect transistors, one respective pair of which is connected between the reference input and a ground potential connection.

In addition, a first switch 904 comprising an n-MOS field-effect transistor and a p-MOS field-effect transistor connected in series therewith is provided. The respective control connections are connected to the input of the first delay element 900. Between the two field-effect transistors of the switch 904 there is a tap which is coupled to a first capacitor $C_1$. A second connection of the first capacitor $C_1$ is in turn connected to a first switching transistor 907 and to a second switching transistor 908. In the same way, the filter contains a further switch 905 which is connected to the input of the second delay element. For reasons of clarity, the further switches are not shown. A final switch 906 is connected to the output of the final delay element 902. Correspondingly, further first capacitors C1 are likewise provided.

The further filters, which are connected to the outputs 195 and 197 of the noise shaper 1, are configured in similar fashion. However, the capacitance of the capacitors $C_2$ differs by the factor 2 from the capacitance of the capacitors $C_1$. The capacitance of the capacitors $C_3$ is greater by a factor of 4 than the capacitance of the capacitors $C_1$.

The switch 908 of each filter is connected to a charging capacitor C4 and to an operational amplifier OP. These take the supplied voltages and produce a current and output it at the output 40. The charging capacitor C4 and the operational amplifier OP together form the conversion device 3.

During operation, the filters are operated in a sampling phase $\Phi 1$ and a subsequent holding phase $\Phi 2$. All the transistors labeled $\Phi 1$ are actuated in this phase and are on. In the holding phase $\Phi 2$, the correspondingly identified transistors are actuated. In the sampling phase $\Phi 1$, the data bit controls the charging operation on the first capacitor $C_1$ via the first switch 904 and is delayed in the delay element 900. In the sampling phase $\Phi 1$, the capacitors are therefore connected either to the reference voltage or to ground.

In the subsequent holding phase $\Phi 2$, the voltage across the capacitors is output to the conversion device 3 via the switch 908. The delay in the elements 900, 901 and 902 rejects the noise components on the individual bit lines as a function of the switching frequency of the phases.

In the embodiment shown, the capacitances of the capacitors C1, C2 and C3 are of different magnitude. Alternatively, the reference voltage Vref for the individual filters can also be chosen differently.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

The invention claimed is:

1. A digital/analog converter, comprising:
   an input configured to receive a first digital word having a first word length;
   a noise shaper coupled to the input and configured to convert the first digital word into a second digital word having a second word length at an output thereof;
   a filter device coupled to the output of the noise shaper and configured to reject noise components in the second digital word and, thereby providing a filtered second digital word at an output thereof;
   a conversion device comprising an input connected to the of output of the filter device and configured to convert the filtered second digital word into an analog signal and provide the analog signal at an output thereof.

2. The digital/analog converter of claim 1, wherein the output of the noise shaper comprises a first suboutput and at least one second suboutput, where a subsignal, comprising one bit of the second digital word, is tapped oft at each suboutput, and at least one suboutput is connected to the filter device.

3. The digital/analog converter of claim 2, wherein the filter device comprises at last two subfilters, and wherein the first suboutput and the at least one second suboutput are connected to a respective subfilter.

4. The digital/analog converter of claim 1, wherein the filter device comprises a passive filter, the passive filter comprising an RC element or an LC element.

5. The digital/analog converter of claim 1, wherein the filter device comprises an active filter, the active filter comprising an amplifier with a first input connected to a signal path , a second input, and an output coupled to one of the two inputs.

6. The digital/analog converter of claim 1, wherein the filter device composes a falter having a low-pass response.

7. The digit/analog converter of claim 1, wherein the filter device comprises a plurality of series-connected delay elements whose inputs are coupled to a respective switching apparatus a configured to control a respective charge store using switched-capacitor technology.

8. The digital/analog converter of claim 1, wherein the noise shaper comprises a sigma-delta modulator.

9. The digital/analog converter of claim 8, wherein the sigma-delta modulator comprises a third-order cascaded modulator.

10. The digital/analog converter of claim 1, wherein the conversion device comprises a plurality of regulatable sources connected to the output of the conversion device, and each comprising a respective control connection coupled to the output of the filter device to provide individual actuation for the sources based thereon.

11. The digital/analog converter of claim 10, wherein the respective one control connection comprises a field-effect transistor arranged between the regulatable source and the output of the conversion device and whose control terminal is coupled to the output of the filter device.

12. The digital/analog converter of claim 10, wherein the sources are respectively configured to output an equal current or voltage signal, or the signal which is output by two of the sources differs by the factor 2.

13. A digital/analog converter, comprising:
a modulator comprising a dock input, a data word input, and an output, configured to noise shape a data word applied to the input using a clock signal at the clock input, and provide a noise-shaped output word at the output thereof;
a plurality of bit lines that form the output of the modulator;
at least one analog filter device connected to at least one of the bit lines, the filter device configured to reject a noise component of a signal on the at least one bit line; and
a conversion device coupled to an output of the filter device, and configured to convert an applied word into an analog signal.

14. The digital/analog converter of claim 13, wherein the analog filter device is connected to each of the bit lines and configured to reject noise components of signals on the bit lines, and the conversion device is connected to an output of the filter device.

15. The digital/analog converter of claim 13, wherein the filter device comprises a passive filter, the passive filter comprising an PC element or an LC element.

16. The digital/analog converter of claim 13, wherein the conversion device comprises a plurality of regulatable voltage sources coupled to the output of the filter device, and configured to operate based on an actuation from the filter device.

17. The digital/analog converter of claim 13, wherein the filter device comprises an active filter, the active filter comprising an amplifier with a first input connected to a signal path, a second input, and an output coupled to one of the two inputs.

18. The digital/analog converter, comprising:
an input configured to receive a first data word having a bandwidth and a noise component in the bandwidth;
a means for converting the noise component in the first digital data word into a signal outside of a frequency range determined by he bandwidth and for producing a second data word having a word length;
a plurality of bit lines configured to output a respective bit from the second data word;
a means for frequency-selective rejection of the signal which is coupled to at least one of the bit lines, thereby producing a filtered digital word; and
a digital/analog converter coupled to the means for rejection, and configured to output an analog signal from the filtered digital word applied to the input thereof.

19. A method for digital/analog conversion, comprising:
providing a first digital word having a first word length;
transforming the first digital word into a second digital word having a second word length, where the second digital word is represented by a number of subwords, and the number corresponds to the second word length;
analog filtering at least one subword from the second digital word; and
producing an analog signal from the filtered second digital word.

20. The method of claim 19, wherein the provision comprises providing a first digital word having a bandwidth and a word length, the first digital word comprising a useful component and a noise component the bandwidth.

21. The method of claim 20, wherein the transformation comprises:
sampling the first digital word using a sampling signal at a sampling frequency;
converting a portion of the noise component within the bandwidth by means of the sampling to a frequency which is greater than or equal to half the sampling frequency; and
producing a second digital word with the useful component and the converted portion of the noise component.

* * * * *

UNITED STATES PATENT AND TRADEMARK OFFICE
CERTIFICATE OF CORRECTION

| | | |
|---|---|---|
| PATENT NO. | : 7,355,541 B2 | |
| APPLICATION NO. | : 11/489037 | |
| DATED | : April 8, 2008 | |
| INVENTOR(S) | : Christoph Schwoerer | |

It is certified that error appears in the above-identified patent and that said Letters Patent is hereby corrected as shown below:

Col. 10 Claim 1, line 29: Please replace words "of output of" with the words --output of--
Col. 10 Claim 2, line 35: Please replace the word "oft" with the word --off--
Col. 10 Claim 6, line 51: Please replace the word "composes" with the word --comprises--
Col. 10 Claim 6, line 51: Please replace the word "falter" with the word --filter--
Col. 10 Claim 7, line 55: Please replace the words "apparatus a configured" with the words --apparatus configured--
Col. 11 Claim 13, line 11: Please replace the word "dock" with the word --clock--
Col. 11 Claim 15, line 32: Please replace the word "PC" with the word --RC--
Col. 12 Claim 18, line 6: Please replace the word "he" with the word --the--
Col. 12 Claim 21, line 36: Please replace the words "frequency which" with the words --frequency signal which--

Signed and Sealed this

Twenty-fourth Day of June, 2008

JON W. DUDAS
*Director of the United States Patent and Trademark Office*